United States Patent
Hoyerby et al.

(10) Patent No.: US 8,229,372 B2
(45) Date of Patent: Jul. 24, 2012

(54) PARALLEL FORWARD PATH CARTESIAN FEEDBACK LOOP AND LOOP FILTER WITH SWITCHABLE ORDER FOR CARTESIAN FEEDBACK LOOPS

(75) Inventors: Mikkel Christian Wendelboe Hoyerby, Koebenhavn SV (DK); Niels-Henrik Lai Hansen, Frederiksberg (DK)

(73) Assignee: Motorola Solutions, Inc., Schaumburg, IL (US)

(*) Notice: Subject to any disclaimer, the term of this patent is extended or adjusted under 35 U.S.C. 154(b) by 322 days.

(21) Appl. No.: 12/725,101

(22) Filed: Mar. 16, 2010

(65) Prior Publication Data
US 2011/0227642 A1    Sep. 22, 2011

(51) Int. Cl.
*H04B 1/04* (2006.01)
(52) U.S. Cl. ........................ 455/126; 330/129
(58) Field of Classification Search .............. 455/91, 455/114.1, 114.2, 115.1, 115.2, 115.3, 118, 455/121, 126, 127.1; 330/129, 136, 149; 375/295, 296
See application file for complete search history.

(56) References Cited

U.S. PATENT DOCUMENTS

| | | | |
|---|---|---|---|
| 5,783,968 A | 7/1998 | Melton | |
| 6,084,468 A * | 7/2000 | Sigmon et al. | 330/136 |
| 6,606,483 B1 * | 8/2003 | Baker et al. | 455/126 |
| 2005/0110567 A1 * | 5/2005 | Rabinovich et al. | 330/149 |
| 2006/0050810 A1 | 3/2006 | Haque et al. | |
| 2011/0201287 A1 * | 8/2011 | Pratt et al. | 455/126 |

FOREIGN PATENT DOCUMENTS
WO    2004057754 A1    7/2004

OTHER PUBLICATIONS

PCT International Search Report Dated Jun. 21, 2011.
Hoyerby, et al. High-Bandwidth, High-Efficiency Envelope Tracking Power Supply for 40W RF Power Amplifier Using Paralleled Bandpass Current Sources; IEEE PESC 2005.
Johansson, et al. "Linearization of Multi-Carrier Power Amplifiers", Abstract, May 2009.
Pipilos, et al. "A Transmitter IC for TETRA Systems Based on a Cartesian Feedback Loop Linearization Technique" IEEE Journal of Solid-State Circuits, vol. 40, No. 3, Mar. 2005.
CML Microcircuits; "Cartesian Feed-Back Loop Transmitter IC", 4 Pages, 2006.
PCT Communication Relating to the Results of the Partial International Search Dated Apr. 6, 2011.

* cited by examiner

*Primary Examiner* — Thanh Le
(74) *Attorney, Agent, or Firm* — Anthony P. Curtis; Daniel R. Bestor

(57) ABSTRACT

A communication device having an RF power amplifier stage with a Cartesian feedback loop is provided. The loop has forward paths whose outputs are combined to form an output signal that is fed back to a single feedback path. Each forward path has a common path with a filter that filters the overall loop response and a unique split path. The main and auxiliary split paths have a power amplifier and carry signals respectively of lower and higher frequencies. The auxiliary amplifier is faster than the main amplifier. Different phases of the carrier signal are used during upconversion such that the overall phase response through the split paths is equal. Instability recovery problems introduced by higher-order loop filters are mitigated by baseband loop filters with switchable order. Upon detecting instability, the loop filter order is reduced and is subsequently increased after eliminating the unstable operation.

20 Claims, 13 Drawing Sheets

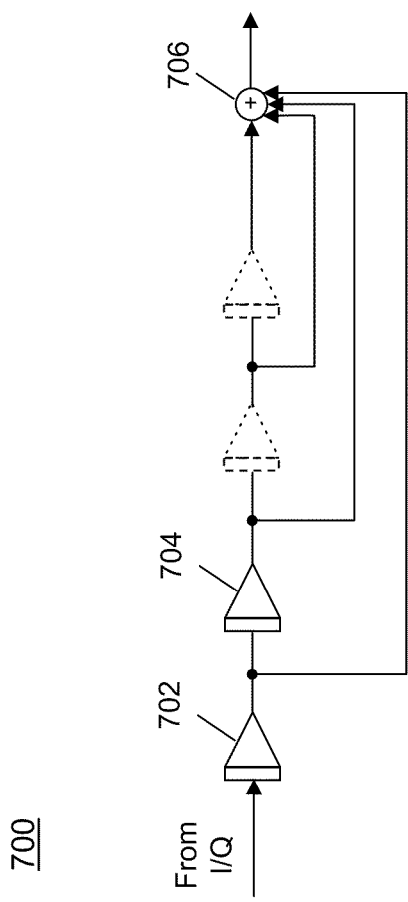
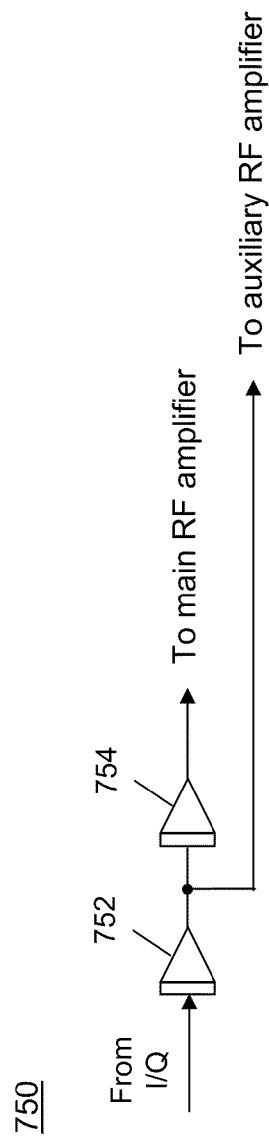

PARALLEL FORWARD PATH CARTESIAN FEEDBACK LOOP AND LOOP FILTER WITH SWITCHABLE ORDER FOR CARTESIAN FEEDBACK LOOPS

TECHNICAL FIELD

The present application relates generally to a communication device and in particular to a communication device containing a feedback loop with multiple forward paths.

BACKGROUND

In many types of electronic applications, especially those that contain power amplifiers, signal distortion plays a significant role. Power amplifiers are used in communication systems, for example, to increase the signal strength of wireless transmissions between a base station and a mobile device such as a cellular telephone or PDA or between base stations. A radio frequency (RF) power amplifier can be disposed in either or both the transmitter or receiver path. Such power amplifiers are used in RF transmitters in which digitally modulated carriers such as TETRA, iDEN, GSM, and CDMA are employed.

In an ideal system, the RF power amplifier is linear and thus the ratio of the output power to the input power does not vary with the input power. However, the RF power amplifier and accompanying circuitry in the signal path are non-ideal and subject to nonlinearities such as intermodulation products and DC offsets that add noise and cause distortion. This is problematic as restrictions on out-of-band emissions may be severe (to the order of −60 dBc to −70 dBc relative to the power in adjacent frequency channels). Hence, different techniques have been developed for improving linearization of the RF power amplifiers. The most prevalent technique is enclosing the power amplifier within a Cartesian feedback loop.

As above, although both base stations and communication devices contain one or more RF power amplifiers and an associated linearization system, increasing the signal fidelity for base stations may be more problematic due to the higher amplification (and more dynamic range of amplification) used. Due to the wide range of technology serviced by base stations, it is desirous for base stations to simultaneously transmit multiple carriers. As the intermodulation between carriers in a single RF power amplifier is relatively large, this is usually accomplished using one RF power amplifier per carrier, resulting in multiple RF power amplifiers each serving a predetermined carrier. It is often attractive to use a single power amplifier for multiple carriers from a cost perspective. Presently-used Cartesian feedback systems provide insufficient linearization when a single multicarrier RF power amplifier is used, for example, in Terrestrial Trunked Radio (TETRA) system whose standard contains relaxed carrier bandwidths and tough restrictions on unwanted signal components.

It would thus be desirable to provide a system in which adequate linearization is provided when a single power amplifier is used over a wide range of carriers.

SUMMARY

Embodiments of RF power amplifier stages and a method of amplifying a complex signal are provided. In one embodiment, the RF amplifier stage contains a Cartesian feedback loop having parallel main and auxiliary forward paths containing a common portion and separate portions. Each forward path has a mixer through which complex signals are upconverted and a power amplifier that amplifies the upconverted signals prior to transmission. The main forward path has a main RF power amplifier while the auxiliary forward path has an auxiliary RF power amplifier with less latency and that provides a smaller power output than the main RF power amplifier. The mixers in the different paths are supplied with carrier signals of the same frequency and different phases such that the overall phase response through the split paths is equal and that synchronous modulation and demodulation is achieved for both main and auxiliary loops of the Cartesian feedback loop. Filters in the forward paths are disposed such that the main forward path carries signals of lower frequencies than the auxiliary forward path. The filtering can be provided by a Cartesian feedback loop filter in the common portion or by individual filters in the separate paths. An instability detector detects unstable operation of the Cartesian feedback loop using signal power. A control unit selects a lower order response of the feedback loop filter to recover stability when instability is detected and restores a higher order response of the feedback loop filter after stable operation has been determined.

In one embodiment, a Cartesian feedback loop contains a feedback loop filter selectable between normal and recovery modes. When in the normal mode a steeper response with decreasing frequency is provided than when in the recovery mode. An instability detector detects unstable operation of the feedback loop. A control unit selects the recovery mode of the feedback loop filter to recover stability of the feedback loop when instability is detected and restores the normal mode of the feedback loop filter after stable operation of the feedback loop has been determined.

In another embodiment, a method of improving linearization in a feedback system includes filtering baseband signals into higher frequency signals and lower frequency signals, upconverting the higher frequency signals and lower frequency signals such that a phase difference is introduced by the upconversion, and power amplifying the upconverted higher and lower frequency signals such that the amplified lower frequency signals have less power than the amplified higher frequency signals, amplification of the lower frequency signals causing a greater group delay than amplification of the higher frequency signals, the phase difference being selected such that synchronous modulation and demodulation is achieved for both main and auxiliary loops in the system. The amplified higher and lower frequency signals are coupled to form an output signal which is then fed back to correct the baseband signals. If the feedback system becomes unstable, the unstable operation is detected and a lower order response is selected when filtering the baseband signals to recover stability of the feedback system and a higher order response restored after stable operation of the feedback system has been recovered.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIGS. 7a and 7b are block diagrams of different types of filters in the common portion of the forward path.

Figure 1:
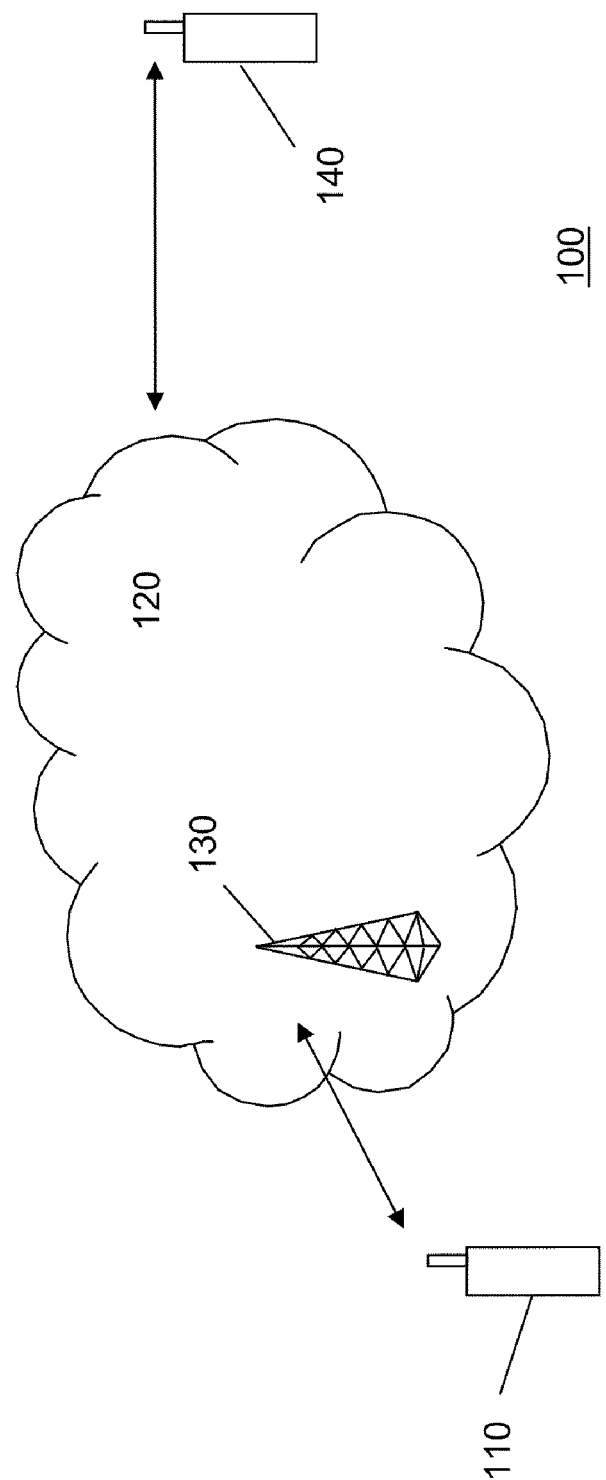
FIG. 1 illustrates one embodiment of a communication system.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of the embodiments of shown.

The apparatus and method components have been represented where appropriate by conventional symbols in the drawings, showing only those specific details that are pertinent to understanding the embodiments shown so as not to obscure the disclosure with details that will be readily apparent to those of ordinary skill in the art having the benefit of the description herein. Other elements, such as those known to one of skill in the art, may thus be present.

DETAILED DESCRIPTION

Before describing in detail the various embodiments, it should be observed that such embodiments reside primarily in combinations of method steps and apparatus components related to linearization of a multicarrier RF power amplifier in a communication device in a communication system. The noise and distortion performance of the Cartesian feedback system is increased while simultaneously maximizing the loop gain through the use of multiple forward paths in the Cartesian feedback loop with different characteristics. At lower offset frequencies, the signal is amplified by an RF power amplifier, while at higher offset frequencies a lower-power auxiliary RF power amplifier path having a lower group delay (latency) is employed. Different phases are used during upconversion such that the overall phase response is equal through the split paths containing the different amplifiers. In addition, instability recovery problems introduced by the use of higher-order loop filters in the Cartesian feedback system are mitigated by the use of baseband loop filters with switchable order. Unstable loop operation following overload conditions is detected using a power detector to measure a baseband or RF error signal. Upon detecting instability, the loop filter order is momentarily reduced to stop the instability. Following elimination of the unstable operation, the loop filter order is increased back its nominal value.

Modern RF transmitters use analog or digital modulated carriers. Among the systems in which carriers are digitally modulated are TETRA, Integrated Global System for Mobile communications (GSM), and Digital Enhanced Network (iDEN) systems. Such systems contain base stations and clients served by the base stations, each of which has an RF transmitter. As discussed above, it is desirable for these transmitters to provide a high-power RF output for the antenna with a minimum of unwanted signal components. High power and signal fidelity are achieved using the combination of an RF power amplifier with linearization for reducing the errors inevitably introduced by the RF power amplifier.

One embodiment of a communication system is illustrated in FIG. 1. The system 100 contains clients 102, 104 and an infrastructure 120. The clients 102, 104 include a transmitter 102 and one or more receivers 104. The transmitter 102 initiates a transmission that is eventually received by the receiver 104. The transmission can be analog or digital and may contain audio, textual and/or visual data. The clients 102, 104 may communicate using any of a number of known modulation types, such as $\pi/4$-DQPSK, 9PSK, QAM in systems such as CDMA, TDMA, OFMA, or TETRA. The clients 102, 104 may be mobile or fixed to one location. The infrastructure 120 includes base stations 130 and other devices, however only one base station 130 is shown for convenience. Each base station 130 serves clients that lie within its cell. The clients 102, 104 may be in the same or different cells. Other infrastructure and mobile elements such as routers, access points, controllers, gateways, consoles, etc, whose messaging protocols may be different, are not shown for convenience.

Figure 2:
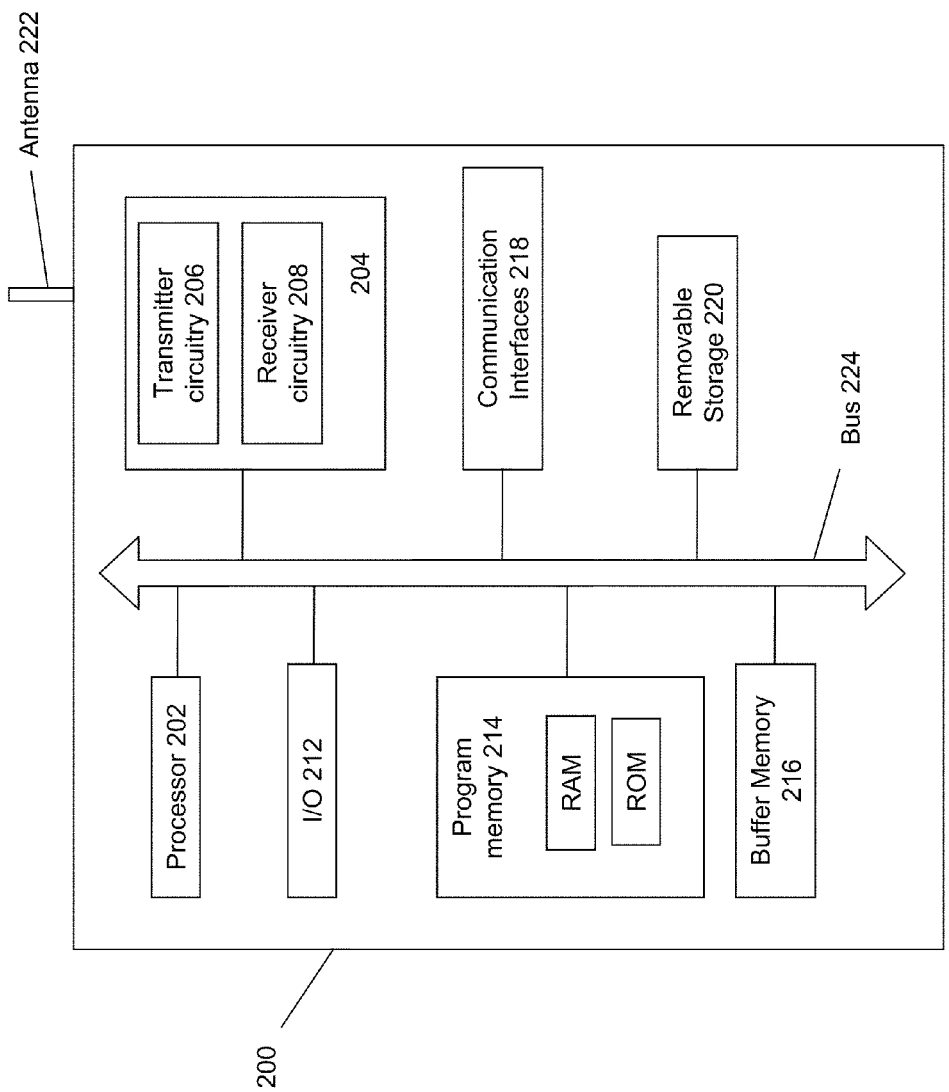
FIG. 2 illustrates a block diagram of an embodiment of a base station.

One example of a base station is shown in the block diagram of FIG. 2. The base station 200 contains, among other components, a processor 202, a transceiver 204 including transmitter circuitry 206 and receiver circuitry 208, an antenna 222, input device(s) 212, a program memory 214 for storing operating instructions that are executed by the processor 202, a buffer memory 216, one or more communication interfaces 218, and a removable storage 220. The base station 200 is preferably an integrated unit containing at least all the elements depicted in FIG. 2, as well as any other element necessary for the base station 200 to perform its electronic functions. Alternatively, the base station 200 may comprise a collection of appropriately interconnected units or devices, wherein such units or devices perform functions that are equivalent to the functions performed by the elements of the base station 200. The electronic elements are connected by a bus 224.

The processor 202 includes one or more microprocessors, microcontrollers, DSPs, state machines, logic circuitry, or any other device or devices that process information based on operational or programming instructions. Such operational or programming instructions are preferably stored in the program memory 214. The program memory 214 may be an IC memory chip containing any form of random access memory (RAM) or read only memory (ROM), a floppy disk, a compact disk (CD) ROM, a hard disk drive, a digital video disk (DVD), a flash memory card or any other medium for storing digital information. One of ordinary skill in the art will recognize that when the processor 202 has one or more of its functions performed by a state machine or logic circuitry, the memory 214 containing the corresponding operational instructions may be embedded within the state machine or logic circuitry. The operations performed by the processor 202 and the rest of the base station 200 are described in detail below.

The transmitter circuitry 206 and the receiver circuitry 208 enable the base station 200 to respectively transmit and receive communication signals. In this regard, the transmitter circuitry 206 and the receiver circuitry 208 include appropriate circuitry to enable wireless transmissions. The implementations of the transmitter circuitry 206 and the receiver circuitry 208 depend on the implementation of the base station 200 and mobile devices with which it is to communicate. For example, the transmitter and receiver circuitry 206, 208 may be implemented as part of the base station hardware and software architecture in accordance with known techniques. One of ordinary skill in the art will recognize that most, if not all, of the functions of the transmitter or receiver circuitry 206, 208 may be implemented in a processor, such as the processor 202. However, the processor 202, the transmitter circuitry 206, and the receiver circuitry 208 have been artificially partitioned herein to facilitate a better understanding.

The antenna 222 comprises any known or developed structure for radiating and receiving electromagnetic energy at the interference frequency. The buffer memory 216 may be any form of volatile memory, such as RAM, and is used for temporarily storing received information. The optional input/output devices 212 may include an LCD, OLED, or any other known display, one or more speakers and microphones, an alpha-numeric keyboard, isolated buttons, soft and/or hard keys, touch screen, jog wheel, and/or any other known input device. The base station 200 may be controlled through such input/output devices 212 either locally or remotely at a command center disposed at any point in the infrastructure.

Figure 3:
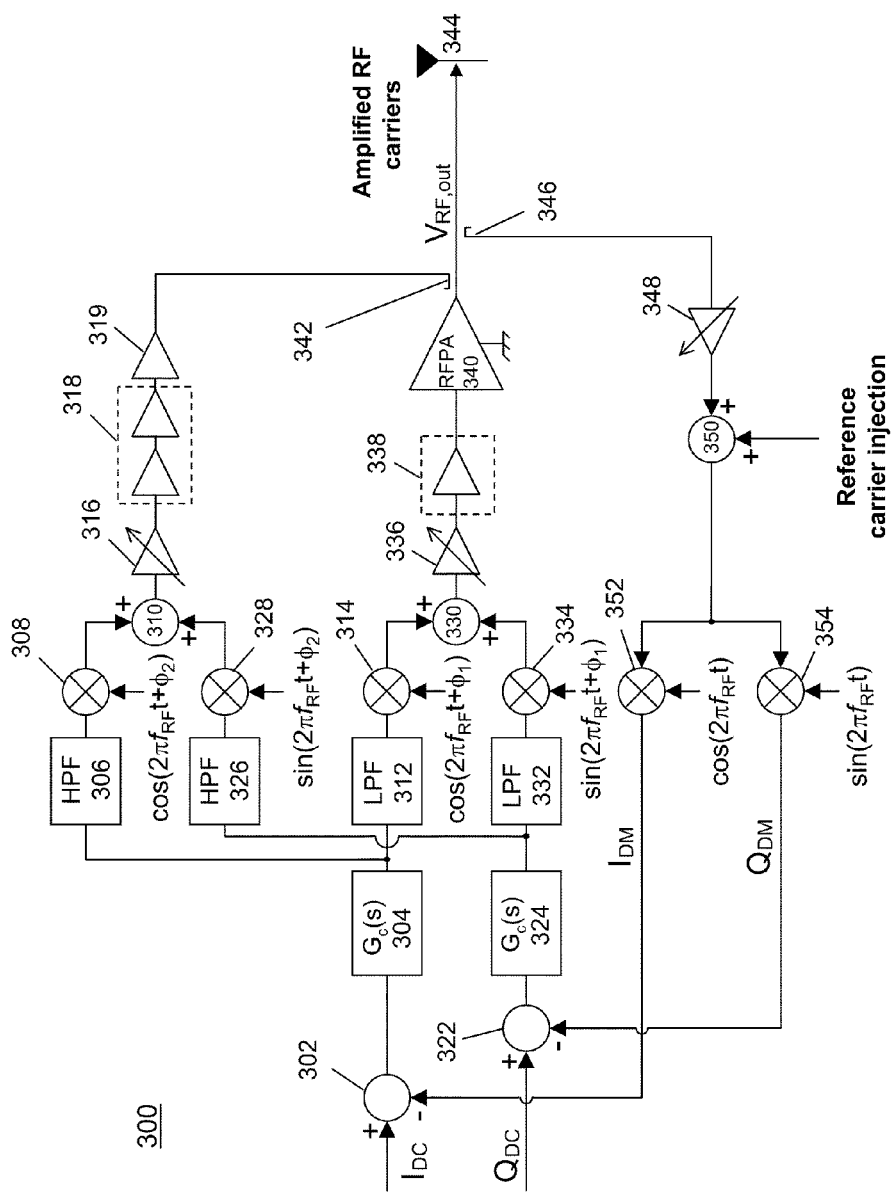
FIG. 3 is a block diagram of an embodiment of a power amplifier stage.

One embodiment of an RF power amplifier stage is shown in the block diagram of FIG. 3. The RF power amplifier stage 300 is supplied with different analog signal components. More specifically, the RF power amplifier stage 300 is supplied with I (in-phase) signal components and corresponding Q (quadrature-phase) signal components 90° out of phase with the I components. The I and Q components are digital signals generated by the processor 202 shown in FIG. 2 and then are converted to analog signals using digital-to-analog converters (not shown) whose outputs are low pass filtered. The I and Q components are thus supplied at a baseband frequency near DC (e.g., within about 1 MHz of DC) and are thus shown as $I_{DC}$ and $Q_{DC}$.

The $I_{DC}$ and $Q_{DC}$ input components, as well as feedback signals from the feedback path of the Cartesian feedback loop are supplied to first and second adders 302, 322. The outputs of first and second adders 302, 322 are provided to first and second filters ($G_c(s)$) 304, 324. The filters 304, 324 pass the bandwidth of the control loop, making sure there is sufficient gain at only these frequencies. In one embodiment, as shown later, the filters 304, 324 may essentially be integrators. The use of these filters 304, 324 in the forward path of the Cartesian feedback loop is well known and will not be described here in detail. The outputs of first and second filters 304, 324 are then each supplied to a high pass filter 306, 326 along a low-power RF path and a low pass filter 312, 332 along a high-power RF path. More specifically, the input $I_{DC}$ component is provided to a first high pass filter 306 and a first low pass filter 312, and the input $Q_{DC}$ component is provided to a second high pass filter 326 and a second low pass filter 332. The high- and low-power RF paths are disposed in parallel: first and second high pass filters 306, 326 are disposed in parallel with each other; the first and second low pass filters 312, 332 are disposed in parallel with each other; and the first and second high and low pass filters 306, 312, 326, 332 are disposed in parallel with each other. The high pass filters 306, 326 and low pass filters 312, 332 have pass bands that generally do not overlap and are determined by the characteristics of main RF power amplifier 340. For example, high pass filter 306, 326 and low pass filters 312, 332 may have the corner frequency higher than the baseband input signals $I_{DC}$, $Q_{DC}$, e.g., of a few MHz.

The filtered $I_{DC}$ and $Q_{DC}$ input components are then upconverted by corresponding individual mixers 308, 314, 328, 334 to the desired carrier frequency, which is in the 300-500 MHz range or 800-900 MHz for TETRA systems. This upconversion can either be direct, as illustrated, or indirect (using an intermediate frequency). In other systems, the carrier frequency may be different. As shown, the first filtered $I_{DC}$ input component is upconverted by a first mixer using a first mixer signal (otherwise known as a local oscillator or LO signal) $\cos(2\pi f_{RF} t + \phi_2)$; the first filtered $Q_{DC}$ input component is upconverted by a second mixer using a second mixer signal $\sin(2\pi f_{RF} t + \phi_2)$; the second filtered $I_{DC}$ input component is upconverted by a third mixer using a third mixer signal $\cos(2\pi f_{RF} t + \phi_1)$; and the second filtered $Q_{DC}$ input component is upconverted by a fourth mixer using a fourth mixer signal $\cos(2\pi f_{RF} t + \phi_1)$. As illustrated, depending on the signal frequency (i.e., the components in the portion of the forward path), a different phase adjustment is used by the mixer 308, 314, 328, 334. In particular, the high-pass filtered $I_{DC}$ and $Q_{DC}$ input components are upconverted using a different phase shift, $\phi_2$, than the low-pass filtered $I_{DC}$ and $Q_{DC}$ input components $\phi_1$. The different phase shifts are used to compensate for the phase shift in each of the forward paths caused by the different components along each branch the Cartesian feedback loop.

After being upconverted, the high pass filtered $I_{DC}$ and $Q_{DC}$ input components are combined at high pass adder 310 and the low pass filtered $I_{DC}$ and $Q_{DC}$ input components are combined at a low pass adder 330. The structure comprising mixers and an adder that combines the I and Q signals from the mixers is also known as a quadrature or I/Q modulator.

The combined signal from the high pass adder 310 is then supplied to first variable attenuator 316 (or variable amplifier), amplified by pre-amplifier 318, and further amplified by auxiliary RF power amplifier 319. Auxiliary RF power amplifier 319 is faster (i.e. has less group delay) and provides lower output power than main RF power amplifier 340, both of which are RF power amplifiers and may be supplied with power using an envelope tracking power supply (not shown) for example. Similarly, the signal from the low pass adder 330 is then supplied to second variable attenuator 336 and then pre-amplified by pre-amplifier 338. The number of amplifiers in pre-amplifier 318, 338 can be the same or different, if desired.

The signal from pre-amplifier 338 is amplified by main RF power amplifier 340. The amplified signal from main RF power amplifier 340 is then combined with the amplified signal from auxiliary RF power amplifier 319 through coupler 342 to create an output voltage signal $V_{RF, out}$. Coupler 342 is a directional coupling structure that minimizes the amount of power from main RF power amplifier 340 driven into the auxiliary RF power amplifier 319 output node.

The output signal $V_{RF, out}$ is then supplied to antenna 344, where the output signal $V_{RF, out}$ is transmitted towards its destination. As above, the signal path through low pass filters 312, 332 is also called a high-power RF path as the signals are supplied to main RF power amplifier 340, while the signal path through high pass filters 306, 326 is called a low-power RF path as the signals are auxiliary RF power amplifier 319, which provides a lower power output than main RF power amplifier 340. Although the main and auxiliary RF power amplifiers 340, 319 are shown as being isolated amplifiers, in other embodiments they may be contained within the same amplifier IC.

Main RF power amplifier 340 is physically larger and has a larger number of matching components, and it thus has a larger latency, than auxiliary RF power amplifier 319. For example, a 200 W LDMOS power amplifier with a 25 ns delay was used together with a 1.5 ns 1 W GaAs auxiliary amplifier.

The shared feedback circuitry added 7 ns delay to both loops, but the total auxiliary path delay is significantly lower (8.5 ns) than the total main path delay (32 ns). The ratio of the total main path delay divided by the auxiliary path delay is 32/8.5=3.8. Thus, it is possible to close a loop with 3.8× higher bandwidth by adding the auxiliary path to the system. Other practical concerns may limit the benefit to perhaps a factor of 3.

The LO phases $\phi_1$, $\phi_2$ for the main and auxiliary mixers 314, 334 and 308, 328 are independently adjustable so that despite the difference in latency between the main and auxiliary RF power amplifiers 340, 319, modulation and demodulation in the overall Cartesian feedback system is synchronous. The LO phases $\phi_1$, $\phi_2$ are adjusted so that a test signal introduced to the I or Q port of the auxiliary mixers 308, 328 produces an output on only the corresponding demodulator I or Q port, with the same applying for a test signal put into the main mixers 314, 334. This ensures that the overall I and Q control loops are orthogonal, i.e., independent and free of interactions. Adjustment of the LO phases $\phi_1$ and $\phi_2$ to maintain the desired phase relationship between the forward paths may be performed independently based on factory calibrations using look-up tables accounting for variations in frequency and temperature, by a training sequence performed in designated training sessions (which could occur at predetermined periods when data is not being transmitted) or by a continuous monitoring process where the quality of the phase setting is detected by an appropriate means and the phases are adjusted accordingly. These phase setting methods may each comprise a digital unit (e.g. a central processing unit/CPU or digital signal processor/DSP) for providing part of the decision making capability.

The output signal $V_{RF, out}$ is also coupled via second coupler 346 into a Cartesian feedback loop. Specifically, the output signal $V_{RF, out}$ is provided to variable (or fixed) attenuator 348 and is then optionally combined with a reference carrier at adder 350. The reference carrier is a low-level signal that is 180° out of phase with the signal from second coupler 346. Thus, the reference carrier is effectively subtracted from the feedback signal, resulting in primarily only a carrier leakage signal, which can be corrected in the manner described in U.S. patent application Ser. No. 12/641,596, entitled "Multi Carrier Leakage Tuning By Error Power Detection," herein incorporated by reference in its entirety.

The reduced feedback signal is split into two different signal paths (I and Q) and downconverted from RF to baseband using fifth and sixth mixers 352, 354. As shown in FIG. 3, the I signal is downconverted to $I_{DM}$ using fifth mixer 352, which is supplied with LO $\cos(2\pi f_{RF}t)$, and the Q signal is downconverted to $Q_{DM}$ using sixth mixer 354, which is supplied with LO $\sin(2\pi f_{RF}t)$. The downconverted $I_{DM}$ and $Q_{DM}$ signals are then respectively supplied to first and second adders 302, 322, where the downconverted feedback signals ($I_{DM}$ and $Q_{DM}$) signals are subtracted from the $I_{DC}$ and $Q_{DC}$ input components.

The loop gain determines the ability of the system to suppress RF power amplifier distortion. As described above, the distortion generated by main RF power amplifier 340 such as intermodulation products occurs at higher frequencies than the carrier signal baseband frequencies. Thus, a wide bandwidth is desirable to correct this distortion. One significant factor limiting the bandwidth of the system, which in turn limits the loop gain at a given frequency, is the group delay at the carrier frequency of main RF power amplifier 340. By reducing or compensating for the group delay of the RF path, closing a fast loop at higher baseband frequencies by using auxiliary RF power amplifier 319, loop gain is provided at these higher frequencies thereby increasing the bandwidth of the Cartesian feedback system. This approach accordingly maximizes the loop gain while minimizing the noise and distortion of the system.

The Cartesian feedback system stage increases the noise and distortion performance obtainable from the RF power amplifier system by maximizing the loop gain through the use of multiple parallel forward paths (i.e., from the adder to the coupler) in the Cartesian feedback loop without using multiple feedback paths (i.e., from the coupler to the adder).

As shown in FIG. 3, the forward paths have a common portion that is common to all of the forward paths and a separate portion that is different for each of the forward paths. It is apparent that although only two such forward paths (one containing the high pass filters and one containing the low pass filters) are shown for the quadrature signal consisting of the I and Q components in FIG. 3, any number of forward paths may be used with the corresponding filters. The forward paths thus include a common path shared by all of the forward paths (containing the loop filter having the bandwidth sufficient to pass a majority of the total baseband-referred RF output power spectrum) followed by a split path that is unique (containing the high-power and low-power paths with the parallel mixers and amplifiers). Of course, the addition of a greater number of paths engenders a tradeoff between circuit cost and complexity, as well as training complexity, with performance.

As shown in FIG. 3, the high-power RF path is disposed in parallel with the faster, low-powered RF path. As the high-power RF path includes the RF power amplifier, it takes a longer time for signals introduced to the high-power RF path to reach the antenna than signals introduced to the low-power RF path. The phases of the signals traversing the high- and low-power RF path are also different due to the different components along these paths. Accordingly, each of the high- and low-power RF path has its own mixer that modulates the baseband signals at the carrier frequency but has different phases. The pass bands of the baseband filters are selected to ensure that the slower, high-power RF path handles the bulk of the power transmitted to the antenna, while the faster, low-power path only handles high-frequency (out-of-band) signals. Out-of-band signals include noise from the main amplification chain (pre and power amplifiers) as well as higher-order intermodulation products introduced by the main RF power amplifier. The different latencies and phases provided in the different paths establish an overall low group delay at high offsets from the carrier and allows the overall loop gain to be higher than with only the high-power RF path present. For carriers of low bandwidth relative to the Cartesian feedback bandwidth (including TETRA, TEDS or multicarrier TETRA), almost all the desired output can be designed to come from the efficient high-power RF power amplifier.

Figure 4:
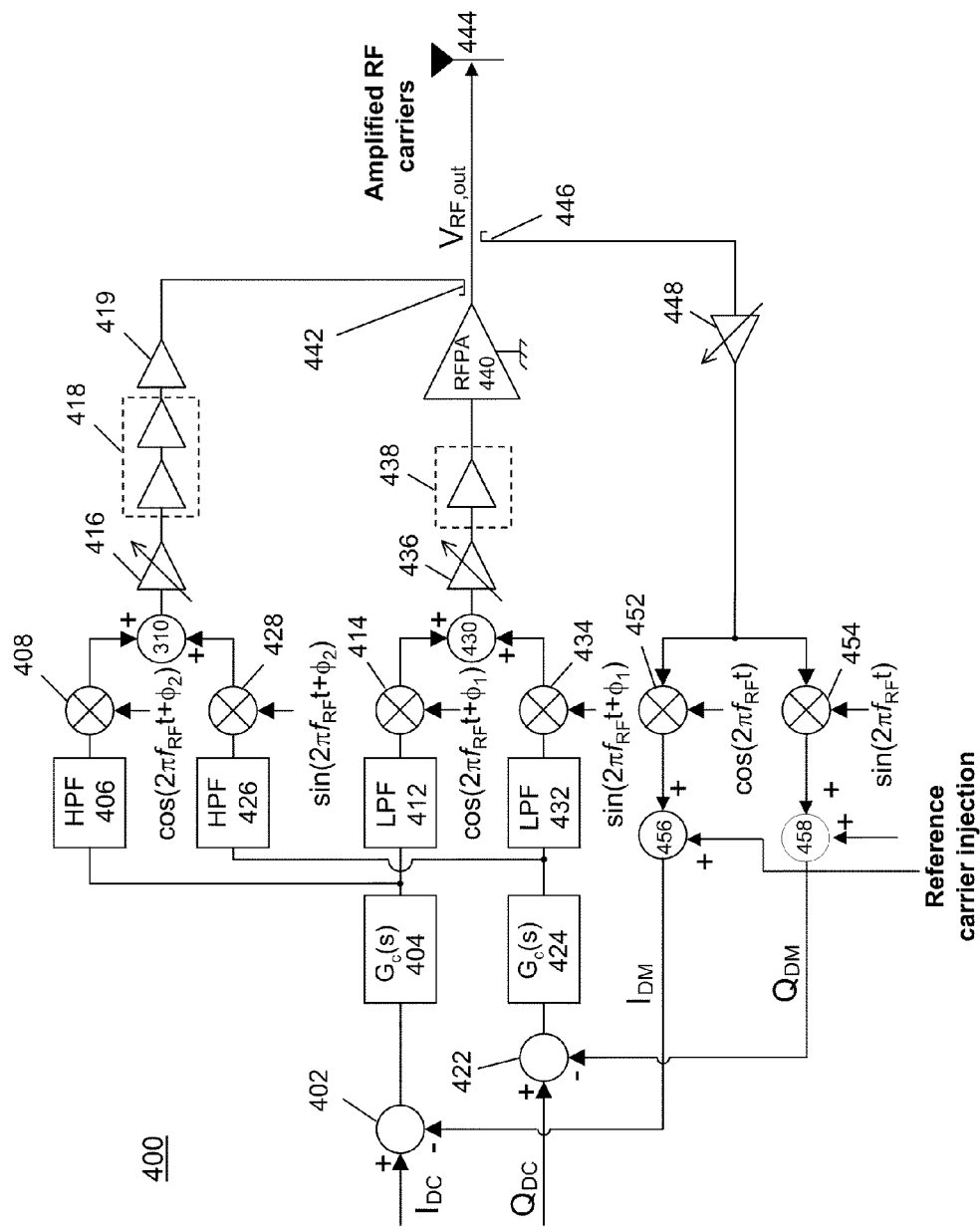
FIG. 4 is a block diagram of another embodiment of a power amplifier stage.

Another embodiment of an RF power amplifier stage is shown in the block diagram of FIG. 4. The embodiments in FIGS. 3 and 4 are similar. The $I_{DC}$ and $Q_{DC}$ input components to the RF power amplifier stage 400 are combined with feedback signals from the feedback path of the Cartesian feedback loop at first and second adders 402, 422. The outputs of first and second adders 402, 422 are provided to first and second filters 404, 424. The outputs of the first and second filters 404, 424 are then each supplied to a high pass filter 406, 426 along a low-power RF path and a low pass filter 412, 432 along a high-power RF path. The filtered $I_{DC}$ and $Q_{DC}$ input components are upconverted by mixers 408, 414, 428, 434, which as above have different phase shifts. The high pass filtered $I_{DC}$ and $Q_{DC}$ input components are combined at high pass adder 410 and the low pass filtered $I_{DC}$ and $Q_{DC}$ input components are combined at low pass adder 430. The combined signal from the high pass adder 410 is supplied to first variable attenuator 416, amplified by a pre-amplifier 418, and amplified by auxiliary RF power amplifier 419. Similarly, the signal from low pass adder 430 is supplied to second variable attenuator 436, amplified by a second set of amplifiers 438 and amplified by RF power amplifier 440. The amplified signal from RF power amplifier 440 is the combined with the amplified signal from auxiliary RF power amplifier 419 through coupler 442 to create an output voltage signal $V_{RF, out}$, which is supplied to antenna 444.

The output signal $V_{RF, out}$ is also coupled via second coupler 446 into a Cartesian feedback loop and is provided to variable attenuator 448. The attenuated feedback signal is split into two different signal paths (I and Q) and downconverted from RF to baseband using mixers 452, 454. The downconverted $I_{DM}$ and $Q_{DM}$ signals are respectively combined with a reference carrier at adder 456, 458. The resulting reduced signal is supplied to first and second adders 402, 422, where the downconverted feedback signals ($I_{DM}$ and $Q_{DM}$) signals are subtracted from the $I_{DC}$ and $Q_{DC}$ input components. Thus, unlike the arrangement of FIG. 3 in which the reference carrier is injected at the carrier frequency, the reference carrier is injected at DC in the arrangement of FIG. 4.

Figure 5:
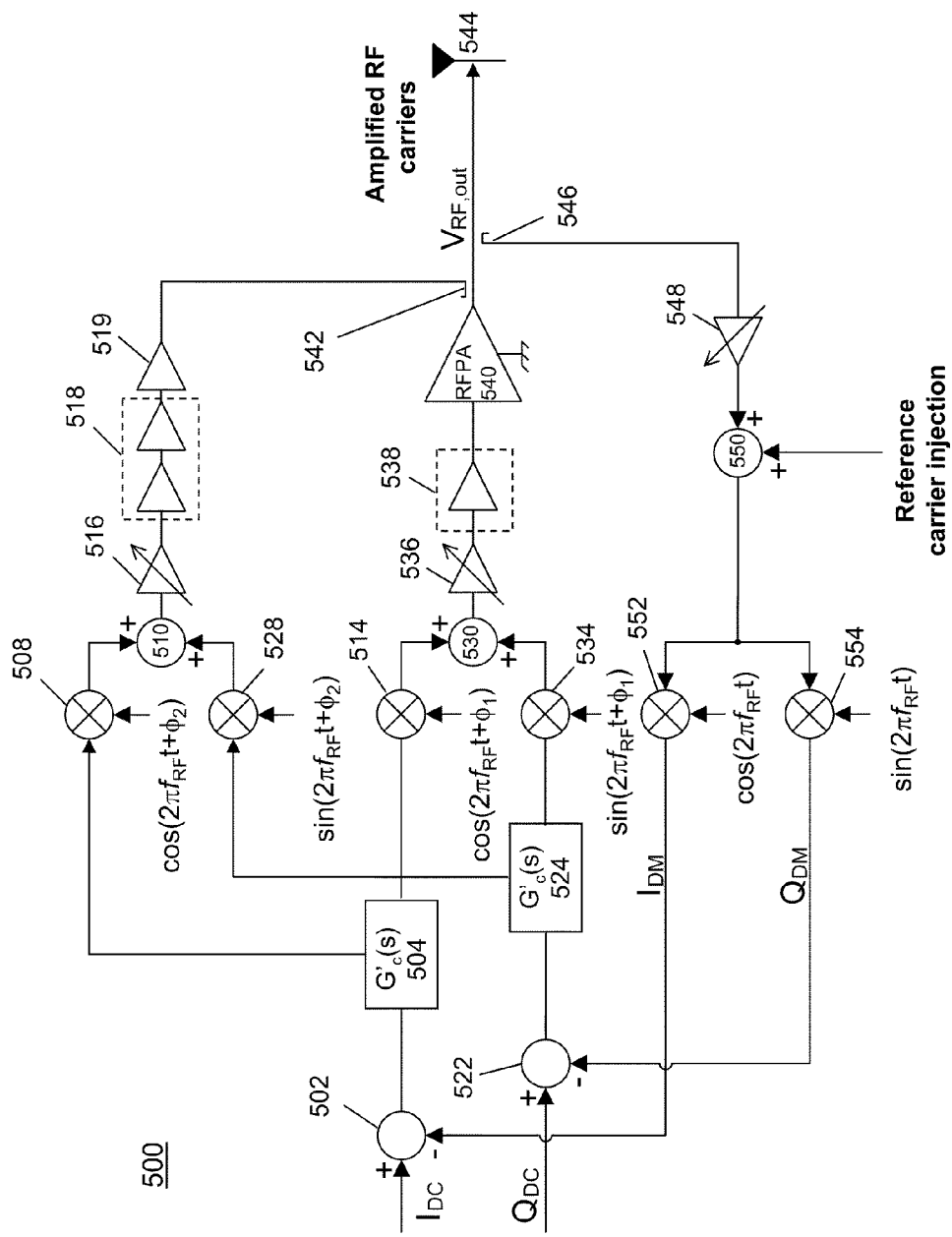
FIG. 5 is a block diagram of another embodiment of a power amplifier stage.

Another embodiment of an RF power amplifier stage is shown in the block diagram of FIG. 5. The embodiments in FIGS. 3 and 5 are again similar. The $I_{DC}$ and $Q_{DC}$ input components to the RF power amplifier stage 500 are combined with feedback signals from the feedback path of the Cartesian feedback loop at first and second adders 502, 522. The outputs of first and second adders 502, 522 are provided to first and second filtering integrators ($G'_c(s)$) 504, 524. First and second filtering integrators 504, 524 provide the same functionality as filters 304, 324 shown in FIG. 3 and additionally provide the same functionality as high and low pass filters 306, 312, 326, 332. The outputs of first and second filtering integrators 504, 524 are upconverted by mixers 508, 514, 528, 534, which as above have different phase shifts. The high pass filtered $I_{DC}$ and $Q_{DC}$ input components are combined at high pass adder 510 and the low pass filtered $I_{DC}$ and $Q_{DC}$ input components are combined at low pass adder 530. The combined signal from the high pass adder 510 is supplied to first variable attenuator 516, amplified by pre-amplifier stage 518, and further amplified by auxiliary RF power amplifier 519. Similarly, the signal from low pass adder 530 is supplied to second variable attenuator 536, amplified by pre-amplifier stage 538 and further amplified by RF power amplifier 540. The amplified signal from RF power amplifier 540 is then combined with the amplified signal from auxiliary RF power amplifier 519 through coupler 542 to create an output voltage signal $V_{RF, out}$, which is supplied to antenna 544.

The output signal $V_{RF, out}$ is also coupled via second coupler 546 into a Cartesian feedback loop and is provided to variable attenuator 548. The attenuated signal is then combined with a reference carrier at adder 550. The reduced feedback signal is split into two different signal paths (I and Q) and downconverted from RF to baseband using mixers 552, 554. The resulting downconverted signal is supplied to first and second adders 502, 522, where the downconverted feedback signals ($I_{DM}$ and $Q_{DM}$) signals are subtracted from the $I_{DC}$ and $Q_{DC}$ input components. Although not shown, like the arrangement of FIG. 4, the arrangement of FIG. 5 can be modified such that the reference carrier is injected at DC.

The filtering integrators 504, 524 (s) are Cartesian feedback loop filters that provide an output that is a weighted sum of the filter input integrated to various orders. For example, a $2^{nd}$-order Cartesian feedback loop filter has an output that contains the first and second-order integral of the filter input. The weighting between first and second-order terms is designed such that the first-order term is dominant (e.g. at least 10 dB higher) at the loop crossover frequency. This helps ensure stable operation of the loop since the phase lag of the loop filter is close to −90° when the first-order integral dominates.

Further integral orders may be added to the Cartesian feedback loop filter in order to enhance its low-frequency gain while preserving the gain and phase behavior at the crossover frequency. This may be generally achieved by letting the higher-order integrators gradually dominate as frequency decreases. Hence, the first-order integrator dominates around the crossover frequency, then the second-order integrator takes over, then the third, etc. At DC, the highest-order integrator will provide the most gain in the loop filter. A standard generalized nth-order filter 700 is shown in FIG. 7a in which the outputs of first and second filtering integrators 702, 704 are combined at an adder 706 along with the output from the remaining higher order filters shown by the dashed lines.

Unlike the nth-order filter shown in FIG. 7a, in which the outputs are added together serially, in the parallel-path Cartesian feedback system of FIG. 7b, components of the loop filter response from filtering integrators 752, 754 are summed separately and used to drive two or more I/Q mixers with associated RF power amplifier paths. In the 2-path system of FIGS. 6 and 7b, the first-order part of the loop filter response is used for the auxiliary path, while the higher orders are directed to the main path. In this case, the first-order loop path (with the example 1.5 ns auxiliary RF amplification delay and 7 ns control circuitry delay) can be closed with a crossover frequency of around 10 MHz. The second and higher-order terms can be made to dominate from around 2 MHz, amplified through a 25 ns RF path. In this case, the $2^{nd}$-order integrator dominates from 2 MHz to about 1 MHz where the $3^{rd}$ order integrator takes over, followed by the $4^{th}$ order integrator from 500 kHz to DC.

Figure 6:
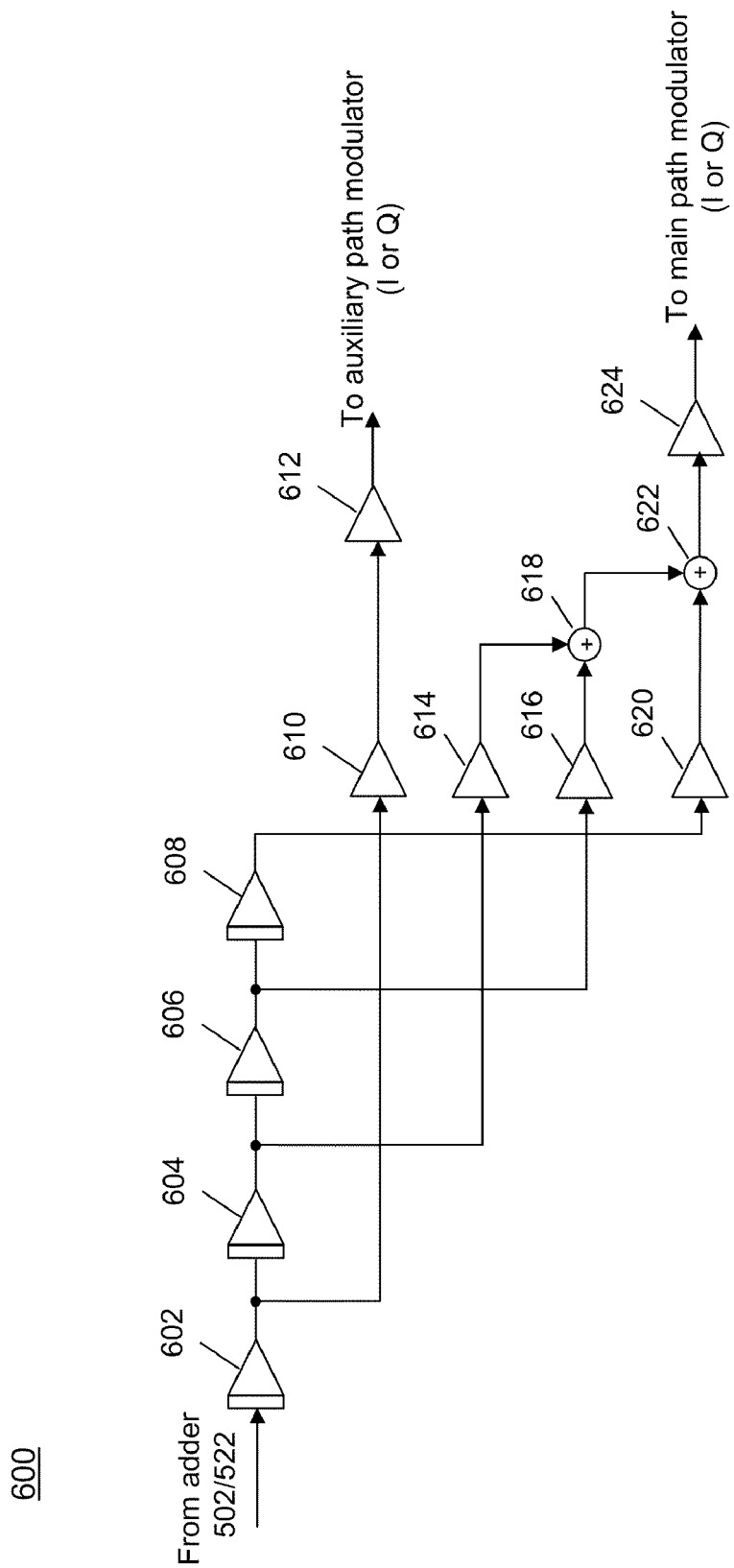
FIG. 6 is a block diagram of the filtering integrator of FIG. 5.

As is apparent from FIG. 5, the outputs of the first and second filtering integrators 504, 524 are supplied directly to mixer 508, 514, 528, 534 without being filtered by high or low pass filters. One embodiment of a fourth-order filtering integrator is shown in FIG. 6. In other embodiments, other order filtering integrators may be used. Note that in the filtering integrator 600 of FIG. 6, only one of the high or low high-power RF paths is shown for convenience as the other path is the same. Assuming the low-power RF path, the signal from adder 556 is supplied to first integrator 602. The output from first integrator 602 is supplied to first amplifier/attenuator 610, whose output is then supplied to second amplifier/attenuator 612 before being upconverted by mixer 508. The term "amplifier/attenuator" is here used to denote circuitry whose overall function is to set the weighting coefficient of a given integral term in the overall loop filter response.

The output from first integrator 602 is also supplied to second integrator 604. Similarly, the output from second integrator 604 is supplied to third amplifier/attenuator 614 and to third integrator 606; the output from third integrator 606 is supplied to fourth amplifier/attenuator 616 and to fourth integrator 608; and the output from fourth integrator 608 is supplied to fifth amplifier/attenuator 620. The integrated signal from third amplifier/attenuator 614 and the integrated signal from fourth amplifier/attenuator 616 are summed at adder 618. Likewise, the first combined signal from adder 618 and the integrated signal from fifth amplifier/attenuator 620 are summed at adder 622. The second combined signal from adder 624 is then upconverted by mixer 514. Note that the integrators 602, 604, 606, 608 in any practical case will have finite DC gain and hence be one-pole low-pass filters.

Figure 8:
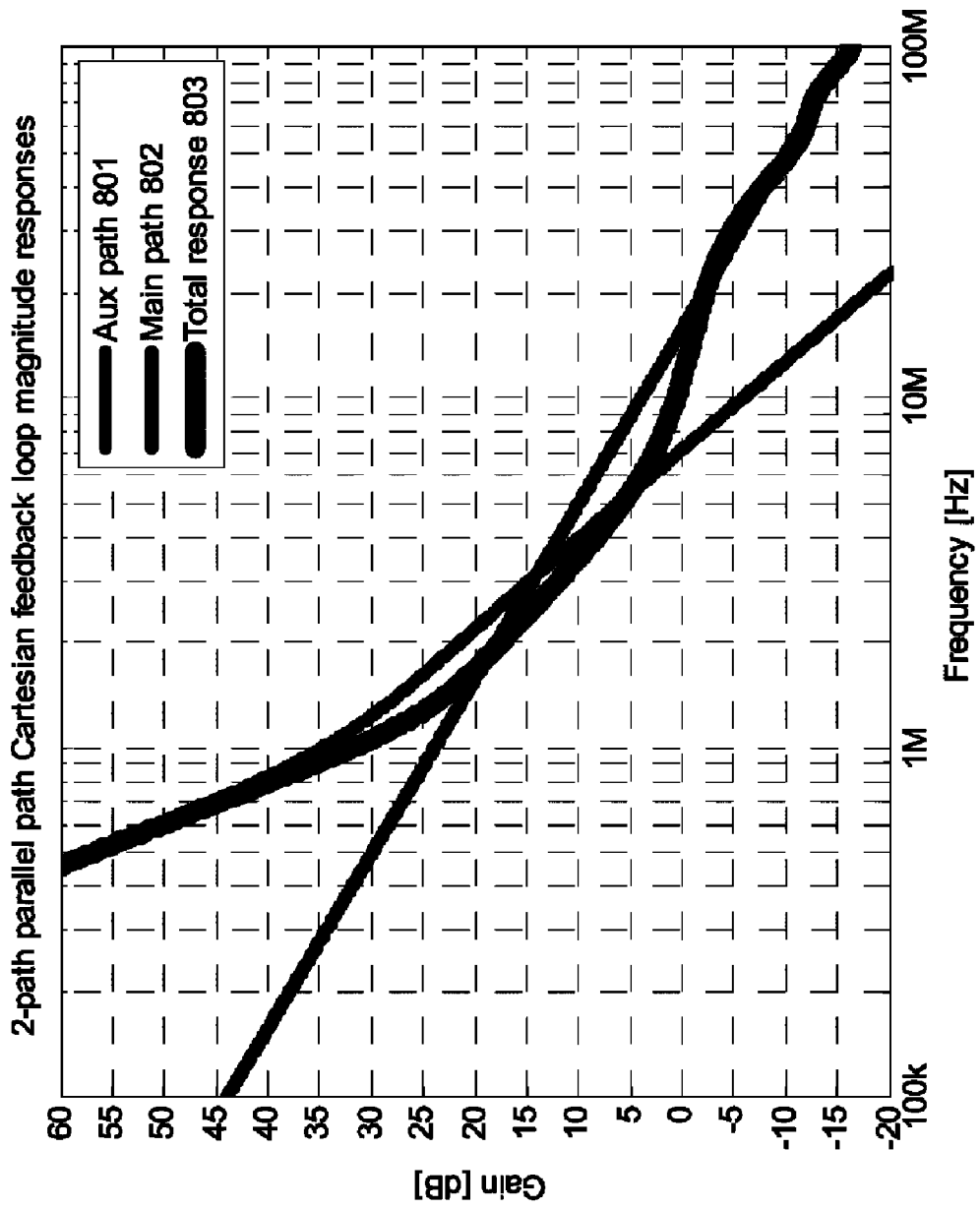
FIG. 8 is a graph of a simulation of gain vs. frequency in one embodiment.

Simulations, as shown in FIG. 8, of the loop gain confirm that the first-order term 801, amplified by auxiliary RF power amplifier 519, predominates at higher frequencies, while the higher-order terms 802, amplified by main RF power amplifier 540, predominate at lower frequencies. Thus, most of the power at the lower frequencies is provided by main RF power amplifier 540. The above arrangement can be designed at around 3 MHz power contributions from main and auxiliary RF power amplifiers 540, 519 are split equally. Above 3 MHz, auxiliary RF power amplifier 519 starts providing most of the amplification. The arrangement can be designed to remain stable for crossover frequencies between around 3-30 MHz. Thus, loop gains 803 in excess of 35 dB can be achieved at 1 MHz offset.

Figure 9:
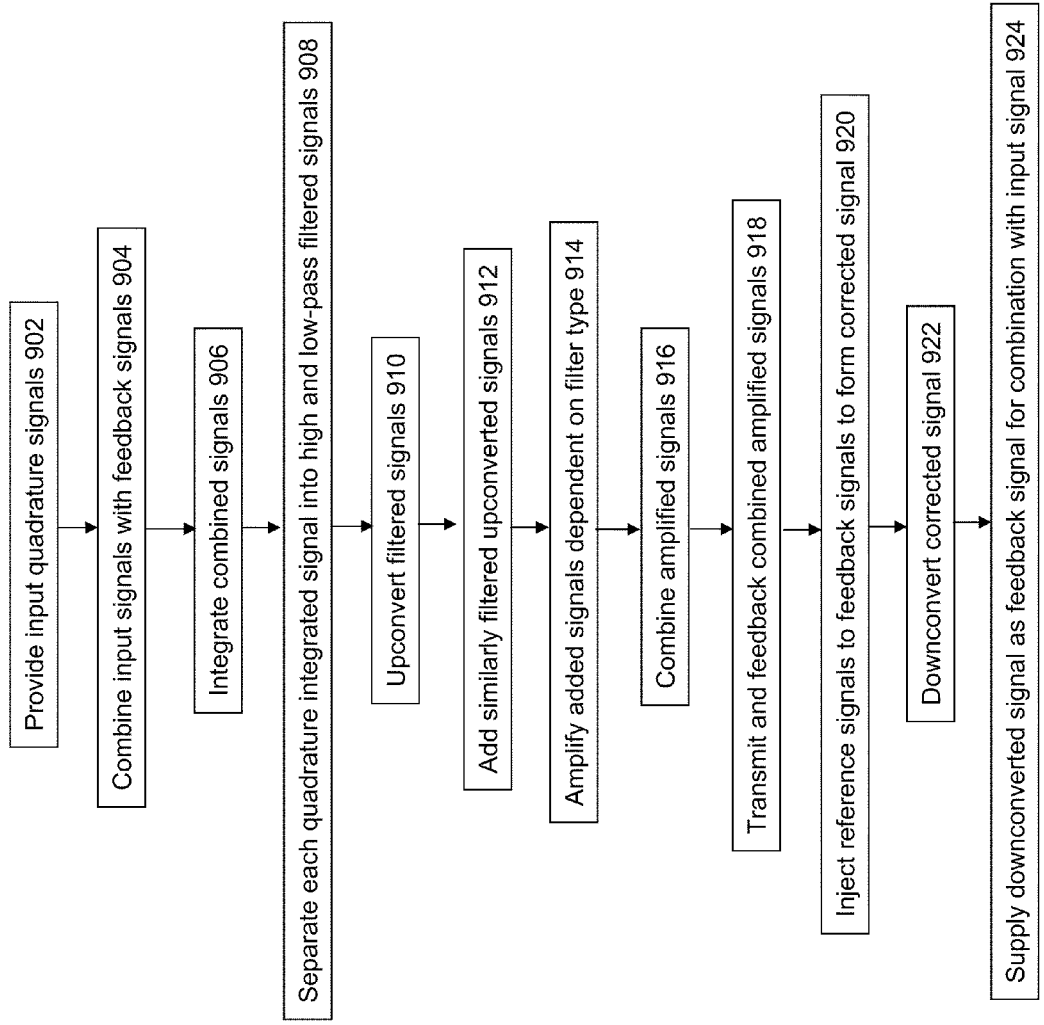
FIG. 9 is a flowchart of one embodiment of operations of the base station.

FIG. 9 illustrates a method of operating the RF power amplifier stage. The input quadrature signals are first supplied at step 902. These input signals are adjusted by combining them with feedback signals at step 904. The combined signals are then filtered/integrated at step 906. Each quadrature signal, having been integrated, is now separated into higher and lower frequency components by high and low pass filters at step 908. Each filtered signal is then upconverted to carrier frequency using different phase shifts in each forward path at step 910 and then the in-phase high-pass filtered signal is added to the quadrature-phase high-pass filtered signal and the in-phase low-pass filtered signal is added to the quadrature-phase low-pass filtered signal at step 912. Each added signal is amplified at step 814 such that the added signals maintain the same overall latency from the along the different forward paths. The amplified signals are combined at step 816 and then supplied to a feedback loop at step 918. The signals in the feedback loop are combined with injected signals, used to eliminate the DC offset in the RF power amplifier stage, at step 920 and then downconverted to baseband at step 922 (or vice-versa). The baseband signals are then supplied to the forward path as the feedback signals at step 924.

Although only a transmitter employing a Cartesian feedback loop is shown, a similar method can be used in a transmitter employing a polar feedback loop. As is clear from the figures and above description, Cartesian feedback compares the output I and Q components with the input I and Q components and adjusts the input I and Q components to compensate for the errors introduced by the power amplifier. Polar feedback, on the other hand, compares the output phase and amplitude to the input phase and amplitude of the power amplifier and adjusts the input to account for the distortions introduced by the power amplifier. In systems employing polar feedback, the power of the output amplitude less the power of the ideal output amplitude is detected and suppressed, prior to being applied to the power amplifier. Examples of such systems are well known and thus will not be described.

The Cartesian feedback system thus includes forward paths that amplify a signal. The forward paths have a common path followed by a unique split path. One of the split paths is a high-power path and another of the split paths is a low-power path. The outputs of high-power and low-power paths are combined to produce an RF output. The high-power path has a first loop filter with bandwidth sufficient to pass a majority of the total RF output power spectrum, and has a relatively large group delay caused by the RF power amplifier used to produce the high power output. The auxiliary, low-power path has a second loop filter passing higher signal frequencies beyond the bandwidth of the first loop filter, and has a relatively smaller group delay that that of the high-power path due to the smaller RF amplifier used to produce the lower power levels at higher signal frequencies. The split path allows a larger overall feedback loop bandwidth than with the high-power path alone. The common path includes additional loop filtering for the overall loop response. A feedback path samples a portion of the RF output signal, processing it, and combining it with an input signal to produce an error signal that is combined with the input signal to the common path.

Given the current RF power amplifier technologies, the two path, $4^{th}$ order system is adequate. Although only two forward paths (through a main RF filter and an auxiliary RF filter) are shown, any number of parallel RF forward paths may be used. Moreover, as indicated above although a $4^{th}$-order loop filter is shown, any order loop filter may be employed. In this case, an auxiliary RF power amplifier providing increasing output power is used with decreasing loop filter order as there is less low-frequency gain in the main baseband path.

The use of higher order loops, however, also engenders complications. High-order loop filters are prone to instability during transient overloads. An instable control system increases noise on the output of the power amplifier stage as well as decreasing correction of the distortion. Furthermore, this instability persists even after the overload has passed. While instability detection is used in sigma-delta analog-to-digital and digital-to-analog data converters, it has primarily been employed to determine the phase adjustment.

Figure 10:
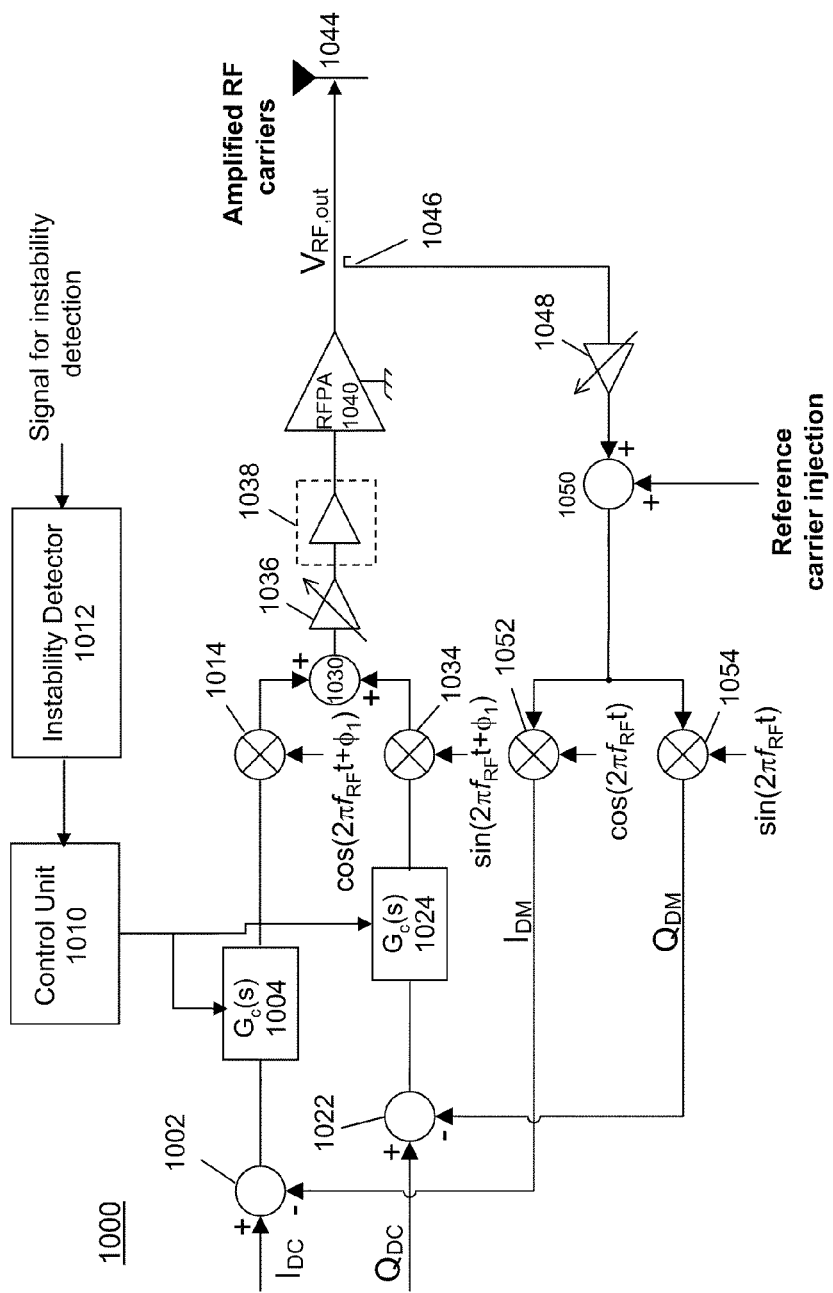
FIG. 10 is a block diagram of another embodiment of a power amplifier stage.

To combat this problem when using higher order filters such as those in FIG. 5, further modification of the filters may be provided as shown in the block diagram of the RF power amplifier stage embodiment of FIG. 10. The $I_{DC}$ and $Q_{DC}$ input components to the RF power amplifier stage 1000 are combined with feedback signals from the feedback path of the Cartesian feedback loop at first and second adders 1002, 1022. The outputs of first and second adders 1002, 1022 are provided to first and second filters ($G_c(s)$) 1004, 1024. First and second filters 1004, 1024 provide the same functionality as filtering integrators 504, 524 shown in FIG. 5. The outputs of first and second filters 1004, 1024 are upconverted by mixers 1014, 1034, which have the same phase shift. The upconverted components are combined at adder 1030. The combined signal is supplied to variable attenuator 1036, amplified by pre-amplifier stage 1038, and further amplified by main RF power amplifier 1040. The amplified signal from RF power amplifier 1040, output voltage signal $V_{RF, out}$ is supplied to antenna 1044. The output signal $V_{RF, out}$ is also coupled via coupler 1046 into a Cartesian feedback loop and is provided to variable attenuator 1048. The attenuated signal is then combined with a reference carrier at RF reference summation node 1050. The reduced feedback signal is split into two different signal paths (I and Q) and downconverted from RF to baseband using mixers 1052, 1054. The resulting downconverted signal is supplied to first and second adders 1002, 1022, where the downconverted feedback signals ($I_{DM}$ and $Q_{DM}$) signals are subtracted from the $I_{DC}$ and $Q_{DC}$ input components.

Figure 11:
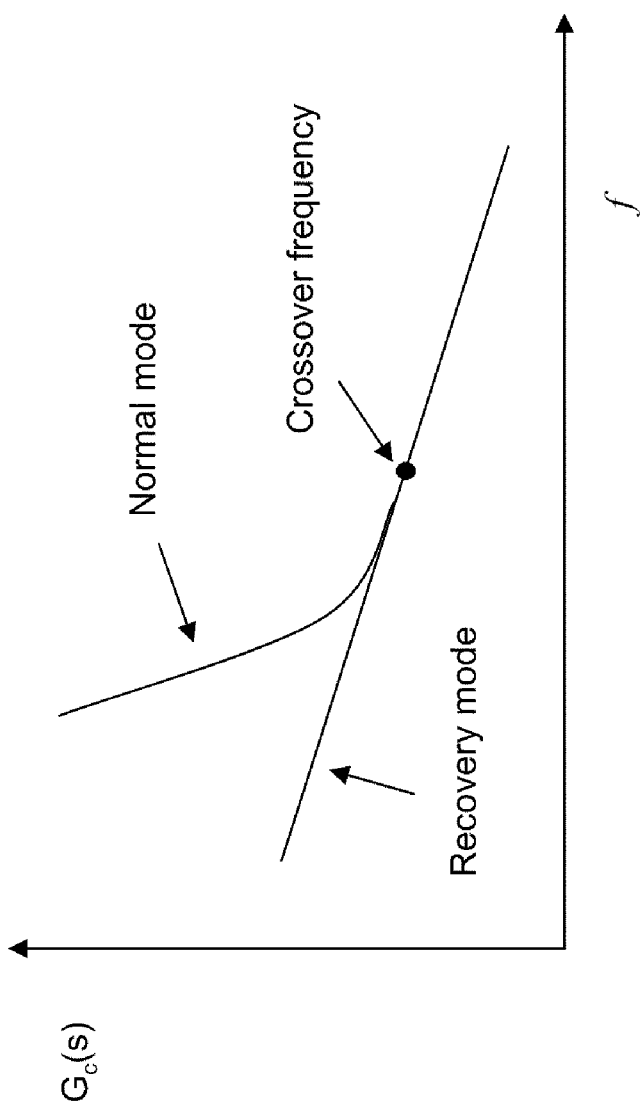
FIG. 11 is a graph of gain vs. frequency for normal and recovery modes in the power amplifier stage of FIG. 10.

The filters 1004, 1024 are higher (nth) order Cartesian feedback loop filters similar to those above but in which the higher order terms can be switched in or out. More specifically, the amplifier stage 1000 contains control unit 1010 and instability detector 1012. Instability detector 1012 is supplied with a desired signal, such as the I or Q baseband error signal ($I_{DM}$ and $Q_{DM}$), the output from baseband loop filter 1004 or 1024 or even the RF error signal (output of RF reference summation node 1050), from which instability of the Cartesian feedback loop can be detected. Instability detector 1012 is connected to control unit 1010, which in turn is connected to filters 1004, 1024. Once an instability of sufficient magnitude (above a predetermined threshold) has been detected by instability detector 1012 using known techniques, a signal is sent from instability detector 1012 to control unit 1010. Control unit 1010 then controls the order of filters 1004, 1024 switching out higher order filtering as desired while still maximizing the overall Cartesian feedback loop gain. The resulting response provided by filters 1004, 1024, shown in FIG. 11, is switched from a normal mode in which the response increases at a higher rate at low frequencies than at high frequencies to a recovery mode in which the response increases essentially linearly throughout the frequency range of the Cartesian feedback loop. Thus, the response of filters 1004, 1024 reduces in steepness at lower frequencies when switching from the normal mode to the recovery mode to a level that is incapable of sustaining oscillations of the system, temporarily effectively resetting the system so that oscillations caused by instability are stopped.

Once the instability is detected to be eliminated by instability detector 1012, instability detector 1012 provides this information to control unit 1010. Control unit 1010 then controls switches in filters 1004, 1024 to switch in the intrinsic higher order filtering, thereby again providing the normal response profile shown in FIG. 11. In the embodiment shown in FIG. 10, control unit 1010 only controls filters 1004, 1024.

Figure 12:
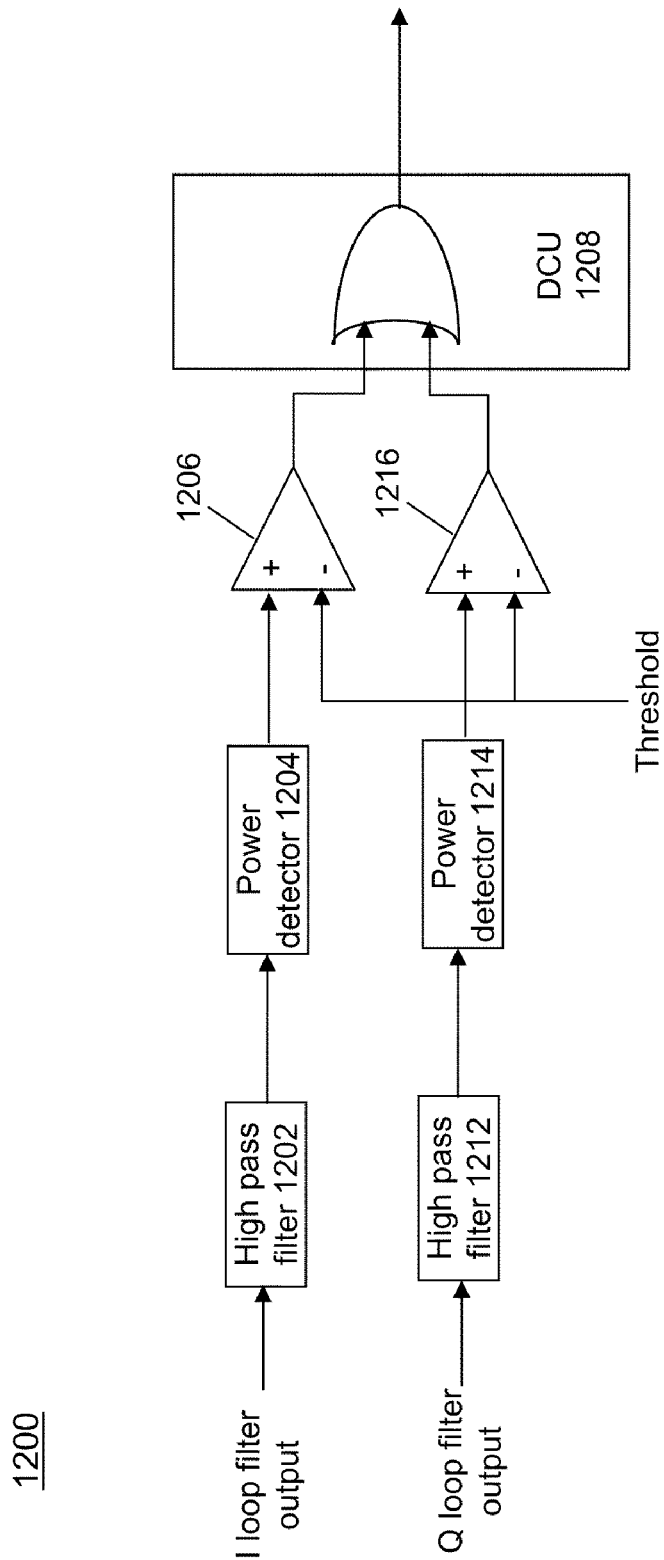
FIG. 12 is a block diagram of an embodiment of the instability detector and control unit in the power amplifier stage of FIG. 10.

One embodiment of an instability detector and control unit is shown in FIG. 12. Instability detector 1200 includes high pass filters 1202, 1212, which respond to any high-frequency oscillations which would occur under instability conditions. The power of each filtered component from high pass filters 1202, 1212 is then detected using power detector 1204, 1214. Power detectors are known and may be, for example, a single or full-wave diode rectifier, optionally with a low-pass filter on the output to avoid response to very brief overload conditions. The power detectors 1204, 1214 provide an output signal that depends on the detected power of the filtered input, which is then compared to a threshold level by comparator 1206, 1208. The threshold level may be set just above the minimum level at which instability is known to be present (e.g., from factory or field tests) or may be set to afford a predetermined amount of margin such that changes in the operating conditions of the power amplifier stage do not permit the system to reach instability. The output of comparators 1206, 1216 are combined in a logical "OR" in digital control unit 1208, whose output is then supplied to filters 1004, 1024. Thus, if the output of either filter 1004, 1024 contains a sufficient amount of high-frequency content, both filters 1004, 1024 are switched to recovery mode. The recovery mode can be employed until stability is again obtained and/or for a predetermined amount of time using a timer (not shown). The higher order terms can be turned off/on all at once or one at a time with the higher order terms being turned off first/turned on last.

Figure 13:
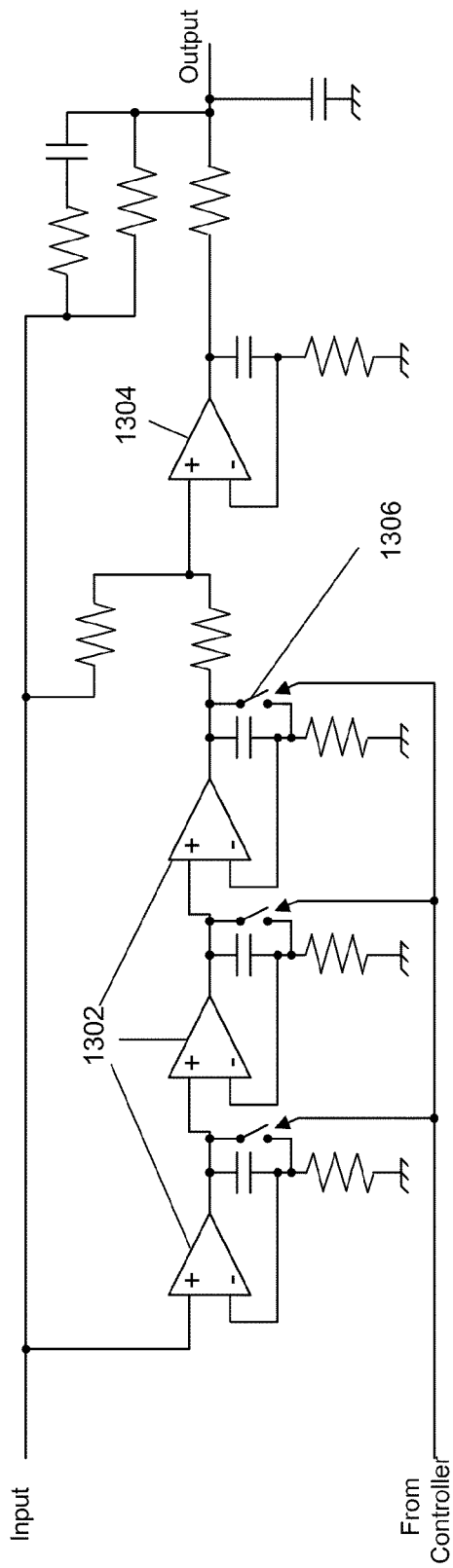
FIG. 13 is a block diagram of an embodiment of the loop filter in the power amplifier stage of FIG. 10.

One example of a switchable loop filter is shown in FIG. 13. In this figure, loop filter 1300 contains several higher order filter stages 1302 with RC filters of different frequencies on their outputs and a final filter stage 1304 for signals of the lowest frequency. The higher order filter stages 1302 each have an analog switch 1306 controlled by the controller unit to selectively short out integration capacitors in the filter circuitry. Thus, the higher order filter stages 1302 have a normal mode (steep response) setting in which the switches 1306 are open and in which the loop gain is maximized and a recovery mode (integrator) setting in which the switches are shorted for instability recovery. The same technique can be used in the loop filters of FIGS. 3-5 and the various permutations described herein.

Simulations using the above permit a re-stabilization cycle time of less than about 150 µs. This short amount of time means that a minimal amount of data may be lost.

The algorithms employed in the above may be a computer program product that includes a series of computer instructions fixed either on a tangible medium, such as a computer readable medium (e.g., flash memory, CD-ROM, ROM, fixed disk). The medium may be a tangible medium (e.g., optical or analog communications lines). The series of computer instructions embodies all or part of the functionality previously described herein with respect to the device. It should appreciate that such computer instructions can be written in a number of programming languages for use with many device architectures or operating systems. Furthermore, such instructions may be stored in any memory device, such as semiconductor, magnetic, optical or other memory—e.g., one of the memories shown in FIG. 2. It is expected that such a computer program product may be distributed as a removable medium with accompanying printed or electronic documentation (e.g., shrink wrapped software) or preloaded with a device (e.g., on system ROM or fixed disk). The computer program product may be run on one or more processors, such as the processor shown in FIG. 2.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure and Summary section are provided to allow the reader to quickly ascertain the nature of the technical disclosure. It is submitted with the understanding that neither will be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

Those skilled in the art will recognize that a wide variety of modifications, alterations, and combinations can be made with respect to the above described embodiments without departing from the spirit and scope of the invention and that such modifications, alterations, and combinations are to be viewed as being within the scope of the inventive concept. Thus, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims issuing from this application. The invention is defined solely by any claims issuing from this application and all equivalents of those issued claims.

The invention claimed is:

1. An RF amplifier stage comprising a feedback loop having parallel main and auxiliary forward paths connected by at least one coupler, each of the main and auxiliary forward path having a mixer through which signals are upconverted to a carrier frequency and an amplifier that amplifies the upconverted signals prior to transmission, the main forward path having a main RF power amplifier and the auxiliary forward path having an auxiliary RF power amplifier with less latency and providing a smaller power output than the main RF power amplifier, main and auxiliary mixers respectively disposed in the main and auxiliary forward paths being supplied with local oscillator signals of the same frequency and different phases such that synchronous modulation and demodulation is achieved for both main and auxiliary loops of the feedback loop, wherein the main and auxiliary forward paths are filtered such that the main forward path carries signals of lower frequencies than the auxiliary forward path.

2. The RF amplifier stage of claim 1, further comprising a feedback loop filter that passes the bandwidth of the feedback loop and is common to the main and auxiliary forward paths in a common portion of the main and auxiliary forward paths.

3. The RF amplifier stage of claim 2, further comprising:
an instability detector that detects unstable operation of the feedback loop; and
a control unit, responsive to the instability detector, that selects a lower order response of the feedback loop filter to recover stability of the feedback loop when instability is detected and restores a higher order response of the feedback loop filter after stable operation has been determined.

4. The RF amplifier stage of claim 2, wherein the main forward path has a low pass filter and the auxiliary forward path has a high pass filter, the high and low pass filters providing the filtering respectively in separate portions of the main and auxiliary forward paths.

5. The RF amplifier stage of claim 4, wherein the low pass filters are disposed in the main forward path more proximate to the Cartesian feedback loop filter than the main mixer and the high pass filters are disposed in the auxiliary forward path more proximate to the feedback loop filter than the auxiliary mixer.

6. The RF amplifier stage of claim 1, wherein the main and auxiliary mixers upconvert baseband signals directly to the carrier frequency for transmission.

7. The RF amplifier stage of claim 1, further comprising a feedback loop filter common to the main and auxiliary forward paths, wherein the feedback loop filter is an integrating filter configured to provide the filtering in a common portion of the main and auxiliary forward paths.

8. The RF amplifier stage of claim 1, wherein the feedback loop has only one feedback path.

9. The RF amplifier stage of claim 8, wherein the feedback path comprises an adder that injects a reference carrier that compensates for DC offset, the reference carrier being injected at a baseband frequency.

10. The RF amplifier stage of claim 8, wherein the feedback path comprises an adder that injects a reference carrier that compensates for DC offset, the reference carrier being injected at the carrier frequency.

11. A Cartesian feedback loop comprising:
a feedback loop filter selectable between normal and recovery modes, the feedback loop filter providing a steeper response with decreasing frequency when in the normal mode than when in the recovery mode;
a mixer through which filtered signals from the feedback loop filter are upconverted to a carrier frequency;
a power amplifier that amplifies the upconverted signals prior to transmission;
an instability detector that detects unstable operation of the feedback loop; and
a control unit, responsive to the instability detector and connected to the feedback loop filter, that selects the recovery mode of the feedback loop filter to recover stability of the feedback loop when instability is detected and restores the normal mode of the feedback loop filter after stable operation of the feedback loop has been determined.

12. The Cartesian feedback loop of claim 11, wherein the feedback loop filter comprises a plurality of integrating filter stages and switches in which capacitors in higher order filter stages are shorted by the switches in the recovery mode and not shorted by the switches in the normal mode.

13. The method of claim 11, further comprising:
detecting unstable operation of the feedback system; and
selecting a lower order response when filtering the baseband signals to recover stability of the feedback system when instability is detected and restoring a higher order response when filtering the baseband signals after stable operation of the feedback system has been determined.

14. A method of improving linearization in a feedback system, the method comprising:
filtering baseband signals into higher frequency signals and lower frequency signals;
upconverting the higher frequency signals and lower frequency signals such that a phase difference is introduced by the upconversion;
power amplifying the upconverted higher and lower frequency signals such that the amplified lower frequency signals have greater power than the amplified higher frequency signals, amplification of the lower frequency signals having a larger latency than amplification of the higher frequency signals, the phase difference being selected to compensate for the difference in latency such synchronous modulation and demodulation is achieved for both main and auxiliary loops of the feedback system;
coupling the amplified higher and lower frequency signals to form an output signal; and
feeding back the output signal to correct the baseband signals.

15. The method of claim 14, further comprising initially filtering the baseband signals using a filter having the bandwidth of the feedback loop prior to filtering the baseband signals into the higher and lower frequency signals.

16. The method of claim 15, wherein the filtering comprises low pass filtering the baseband signals in a main forward path to produce the lower frequency signals and high pass filtering the baseband signals to produce the higher frequency signals in an auxiliary path separate from the main forward path.

17. The method of claim 14, wherein the filtering comprises integrating the baseband signals such that the filtering provides the filtering of the baseband signals into the higher and lower frequency signals in a forward path common to the higher and lower frequency signals.

18. The method of claim 14, wherein feeding back the output signal comprises feeding back the output signal to a single feedback path in a Cartesian feedback loop.

19. The method of claim 18, further comprising injecting a reference carrier that compensates for DC offset into the feedback path, the reference carrier being injected at a baseband frequency.

20. The method of claim 19, further comprising injecting a reference carrier that compensates for DC offset into the feedback path, the reference carrier being injected at the carrier frequency.

* * * * *

UNITED STATES PATENT AND TRADEMARK OFFICE
CERTIFICATE OF CORRECTION

PATENT NO.        : 8,229,372 B2                                              Page 1 of 1
APPLICATION NO.   : 12/725101
DATED             : July 24, 2012
INVENTOR(S)       : Hoyerby et al.

It is certified that error appears in the above-identified patent and that said Letters Patent is hereby corrected as shown below:

In Column 12, Line 45, delete "$V_{RF,\ out}$/is" and insert -- $V_{RF,\ out}$, is --, therefor.

Signed and Sealed this
Eighth Day of January, 2013

David J. Kappos
*Director of the United States Patent and Trademark Office*